(12) United States Patent
Jiang

(10) Patent No.: US 6,711,599 B2
(45) Date of Patent: Mar. 23, 2004

(54) LIMIT-CYCLE-ABSENT ALLPASS FILTER LATTICE STRUCTURE

(75) Inventor: Zhongnong Jiang, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 509 days.

(21) Appl. No.: 09/725,663

(22) Filed: Nov. 29, 2000

(65) Prior Publication Data

US 2002/0052904 A1 May 2, 2002

Related U.S. Application Data

(60) Provisional application No. 60/169,007, filed on Dec. 3, 1999.

(51) Int. Cl.[7] .............................................. G06F 17/10
(52) U.S. Cl. ...................... 708/318; 708/306; 708/320
(58) Field of Search ................................ 708/320, 318, 708/306

(56) References Cited

U.S. PATENT DOCUMENTS

| | | | |
|---|---|---|---|
| 4,569,030 A | * | 2/1986 | Butterweck et al. ........ 708/320 |
| 4,623,872 A | | 11/1986 | Rainer |
| 4,823,296 A | | 4/1989 | Millar |
| 4,825,396 A | | 4/1989 | Gazzi |
| 5,015,934 A | | 5/1991 | Holley et al. |
| 5,148,382 A | | 9/1992 | Kishi |
| 5,448,010 A | | 9/1995 | Smith, III |
| 5,623,318 A | | 4/1997 | Lee |
| 5,629,881 A | | 5/1997 | Leeb et al. |
| 5,636,322 A | | 6/1997 | Ono |
| 5,740,091 A | | 4/1998 | Fukui et al. |
| 5,798,954 A | | 8/1998 | Ishibata |
| 6,112,218 A | * | 8/2000 | Gandhi et al. .............. 708/320 |
| 6,263,354 B1 | * | 7/2001 | Gandhi ....................... 708/320 |

* cited by examiner

*Primary Examiner*—David H. Malzahn
(74) *Attorney, Agent, or Firm*—April M. Mosby; Wade James Brady, III; Frederick J. Telecky, Jr.

(57) ABSTRACT

A lattice-based second-order allpass filter (200) providing a digital filter, absent of limit cycles, includes interconnected quantizers(214, 224), delays (232, 240), multipliers (210, 220), and adders (208, 216, 228) for defining a transfer function, where the circuit corresponds in order and values to intrinsic values of the transfer function. The quantizers are connected in series after the multipliers to eliminate any double precision additions which give rise to the appearance of parasitic oscillations. The savings in hardware results from locating the quantizers after the multipliers; thus, eliminating all double precision additions that are mandatory in the classical second-order lattice structure. The second-order allpass filter coefficients that retain the limit-cycle-absent property of the filter correspond to specific guidelines.

2 Claims, 1 Drawing Sheet

LIMIT-CYCLE-ABSENT ALLPASS FILTER LATTICE STRUCTURE

This application claims priority under 35 U.S.C. 119(e) based upon Provisional Application Ser. No. 60/169,007, filed Dec. 3, 1999.

FIELD OF THE INVENTION

This invention pertains to digital signal processing and more particularly to limit cycle-absent second-order allpass digital filters.

BACKGROUND OF THE INVENTION

In conventional Infinite Impulse Response (IIR) digital filters, limit cycles are sometimes referred to as a multiplier round-off limit cycle. These are low-level oscillations that can exist in an otherwise stable filter as a result of the nonlinearity associated with rounding or truncating internal filter calculations. These limit cycles, usually under the zero-input condition, encountered in a recursive digital filter using finite word-length computations are a common problem that are annoying and difficult to eliminate. The cause of limit cycles or zero-input oscillations lies in the use of non-linear quantizers in the feedback loops of a recursive digital filter. Since a limit cycling filter behaves as a weak non-linear system, it is quite complicated or even impossible to prescribe the conditions under which limit cycles will indeed occur. Nor is it a simple task to design limit-cycle-absent digital filters in a generalized sense.

Limit cycles can exist in both fixed-point and floating-point IIR digital filter implementations. Many techniques have been proposed for testing a realization for limit cycles and for bounding their amplitude when they do exist. In fixed-point realizations it is possible to prevent limit cycles by choosing a state-space realization for which any internal transient is guaranteed to decay to zero and then using magnitude truncation of internal calculations in place of rounding.

As an example in one application, with the use of first and second order allpass filters as building blocks to design audio equalizers, it is still difficult to actually achieve limit-cycle absent systems that are more efficient. Even employing some specific techniques given in "Insights into digital filters made as the sum of two allpass functions," A. N. Willson, Jr. and H. Orchard, IEEE Trans. Circuits Systems, vol. 42, p. 129–137, lattice networks do not eliminate limit cycle oscillations. In addition, according to "Explicit formulas for lattice wave digital filters," L. Gazsi, IEEE Trans. Circuits Systems, vol. CAS-32, p. 68–88, 1985, wave digital filters tend to be almost free of limit cycle parasitic oscillations but do not eliminate limit cycle parasitic oscillations. Neither do the digital filter techniques employed in "A class of low-noise computationally efficient recursive digital filters with applications to sampling rate alternation," R. Ansari and B. Liu, IEEE Trans. Acoust. Speech, Signal processing, vol. ASSP-33, p. 90–97, Feb. 1985, actually achieve limit-cycle-absent systems. All of the aforementioned references provide examples of attempts to achieve limit-cycle-absent systems and are incorporated by reference herein.

An alternative embodiment of direct form IIR filter realization used to reduce limit cycles is the lattice realization which is usually formed directly from an unfactored and unexpanded transfer function. The implementation of stable first-order allpass filters, such as the allpass filter 10 shown in FIG. 1, does not suffer a limit cycle problem if the quantizer located behind the multipliers meets the Barkin conditions disclosed in "Frequency domain criteria for the absence of zero-input limit cycles in nonlinear discrete-time systems, with applications to digital filters," T. Claasen et al., IEEE Trans. Circuits System, vol. CAS-22, p.232–239, March 1975, which is incorporated by reference herein. The Barkin conditions require that the quantization function exhibit magnitude truncation.

For second-order allpass filters, such as the allpass filter 50 shown in FIG. 2, however, the magnitude truncation alone fails to ensure limit-cycle absent systems. Thus, more complicated techniques must be implemented. The frequency domain criteria is disclosed in the Claasen paper. To establish the number of sufficient conditions in order to achieve limit-cycle-absent allpass filters, double precision computing is implemented. Double-precision computing involves positioning two magnitude-truncation quantizers in front of the delay elements. In this way the limit-cycle absent objective is reached and the expense relating to performing double-precision computations is reduced or avoided.

FIG. 3 displays the modified filter structure of FIG. 2 which includes a zero-input and introduces two magnitude-truncation quantizers that are positioned before the delay elements. Since the type-0 lattice structure allpass filter 100 of FIG. 3 includes quantizers positioned right before the delay elements, each state variable is quantized independently of others. Unfortunately, the type-0 lattice structure requires many more computations because double precision numbers occur after the multipliers.

Therefore, it would be desirable to have an allpass digital filter, absent of limit cycles, having minimum hardware requirements and computations.

SUMMARY OF THE INVENTION

The present invention provides a lattice-based second-order allpass filter wherein the structure promotes a digital filter, absent of limit cycles. A digital filter circuit includes interconnected quantizers, delays, multipliers, and adders for defining a transfer function, where the circuit corresponds in order and values to intrinsic values of the transfer function. The quantizers are connected in series after the multipliers to eliminate any double precision additions which give rise to the appearance of parasitic oscillations. The savings in hardware results from locating the quantizers after the multipliers; thus, eliminating all double precision additions that are mandatory in the classical second-order lattice structure. The second-order allpass filter coefficients that retain the limit-cycle-absent property of the filter correspond to specific guidelines.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein.

DETAILED DESCRIPTION OF PREFERRED EMBODIMENTS

Figure 1:
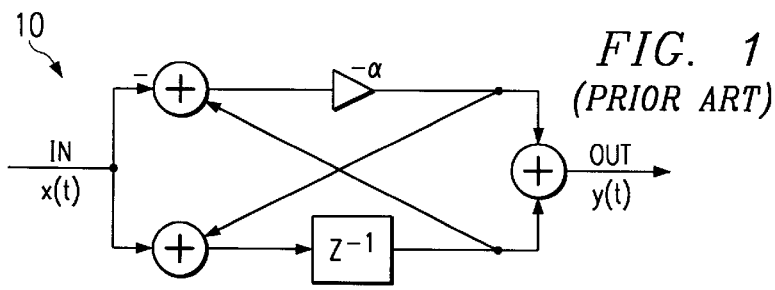
FIG. 1 is a schematic of a first-order allpass filter lattice structure.
Figure 2:
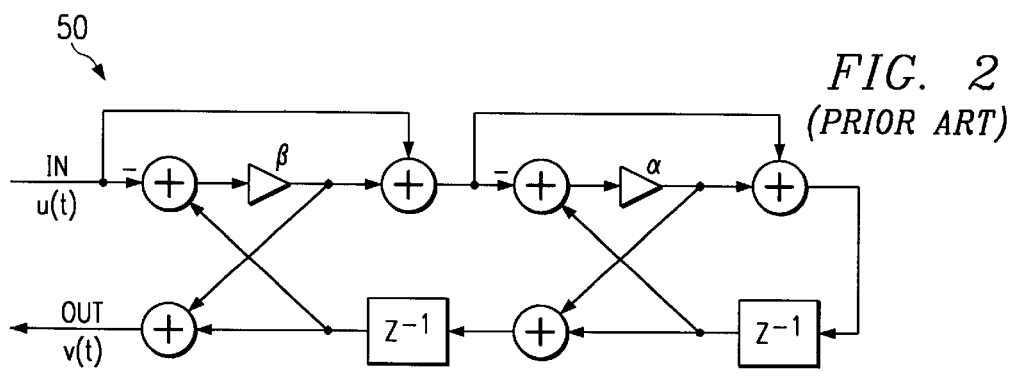
FIG. 2 is a schematic of a second-order allpass filter lattice structure.
Figure 3:
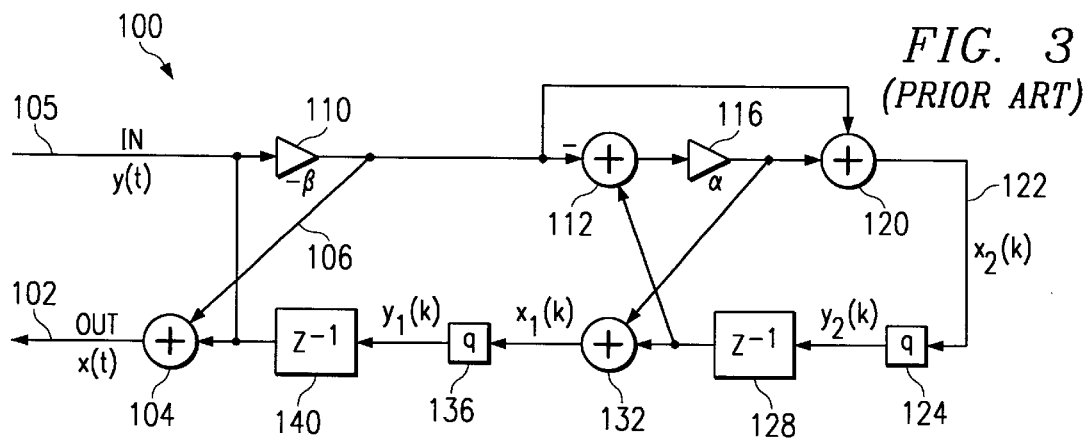
FIG. 3 is a type-0 second-order allpass lattice filter with two quantizers.

The present invention is best understood by comparison with the prior art. Hence, this detailed description begins with a discussion of known second-order allpass lattice structure as illustrated in FIG. 3. FIG. 3 displays the modified filter structure of FIG. 2 which includes a zero-input and introduces two magnitude-truncation quantizers that are positioned before the delay elements. $X_1(z)$, $X_2(z)$, $Y_1(z)$ and $Y_2(z)$ are z-transforms of $x_1(k)$, $x_2(k)$, $y_1(k)$ and $y_2(k)$, respectively.

In the embodiment shown in FIG. 3, the signal y(t) to be filtered is applied to signal input 105, and thereby to multiplier 110. The signal output of multiplier 110 is applied to accumulators 104, 112, and 120. The signal output of accumulator 112 is applied to multiplier 116. The signal output of multiplier 116 is applied to accumulators 120 and 132. The signal 122 output of accumulator 120 is applied to quantizer 124. The signal output of quantizer 124 is applied to unit delay 128. The signal output of unit delay 128 is applied to accumulators 112 and 132. The signal output of accumulator 132 is applied to quantizer 136. The signal output of quantizer 136 is applied to unit delay 140. The signal output unit delay 140 is applied to accumulator 104. The outputs of multiplier 110 and unit delay 140 along with the signal input 105 are summed at output accumulator 104 to produce the filter output 102, represented by signal z(t).

Following the rules outlined in "Frequency domain criteria for the absence of zero-input limit cycles in nonlinear discrete-time systems, with applications to digital filters," T. Claasen et al., IEEE Trans. Circuits System, vol. CAS-22, p.232–239, March 1975, a 2×2 transmission matrix W(z) is determined by the equation:

$$X(z)=W(z)Y(z)$$

where $X(z)=[X_1(z)X_2(z)]^T$ and $Y(z)=[Y_1(z)Y_2(z)]^T$. Theorem 4 in the aforementioned Claasen et al. paper states that, if for m=0 to L/2((L-1)/2 with L being odd), the Hemitian part of:

$$W(z_m)-\text{DIAG}(1)$$

is negative definite, where $Z_m=e(2^{i(2m\pi/L)}$, limit cycles of length L will be absent.

The transmission matrix W(z) of the system depicted in FIG. 3 is given by:

$$W(z) = \begin{bmatrix} -\alpha\beta z^{-1} & (1-\alpha)z^{-1} \\ -\beta(1+\alpha)z^{-1} & -\alpha z^{-1} \end{bmatrix} \quad [2]$$

$$W_H = \frac{1}{2}\begin{bmatrix} (-\alpha\beta z^{-1}-\alpha\beta z-2) & ((1-\alpha)z^{-1}-\beta(1+\alpha)z) \\ (-\beta(1+\alpha)z^{-1}+(1-\alpha)z) & (-\alpha z^{-1}-\alpha z-2) \end{bmatrix}$$

To find out whether the above matrix is negative definite or not, the roots of the polynomial $|\lambda I-W_H|=\lambda^2+b\lambda+c$ are examined. Simple algebraic manipulations produce the two parameters b and c as:

$$b=2+\alpha(1+\beta)\cos\phi$$

$$c=1-0.25((1-\alpha)^2+\beta^2(1+\alpha)^2)-0.5\beta(1-\beta^2)+\alpha(1+\beta)\cos\phi+\beta(\cos\phi)^2 \quad [3]$$

Recall that the absolute values of $\alpha$ and $\beta$ are less than 1 for the sake of stability. Thus, we have b>0. The positive value for c, however, is not guaranteed for all possible values of ($\phi$, $\alpha$, and $\beta$). Nevertheless, in the calculation of equation [3] specified values of $\alpha$ and $\beta$ may be selected to insure that b>1 and c>0. Notice that the lattice structure of FIG. 3 is a type-0 which includes quantizers positioned right before the delay elements. Thus, each state variable is quantized independently of others. Unfortunately, the type-0 lattice structure requires many more computations because double precision numbers occur after the multipliers.

Therefore, it would be desirable to have an allpass digital filter, absent of limit cycles, having minimum hardware requirements and computations.

Figure 4:
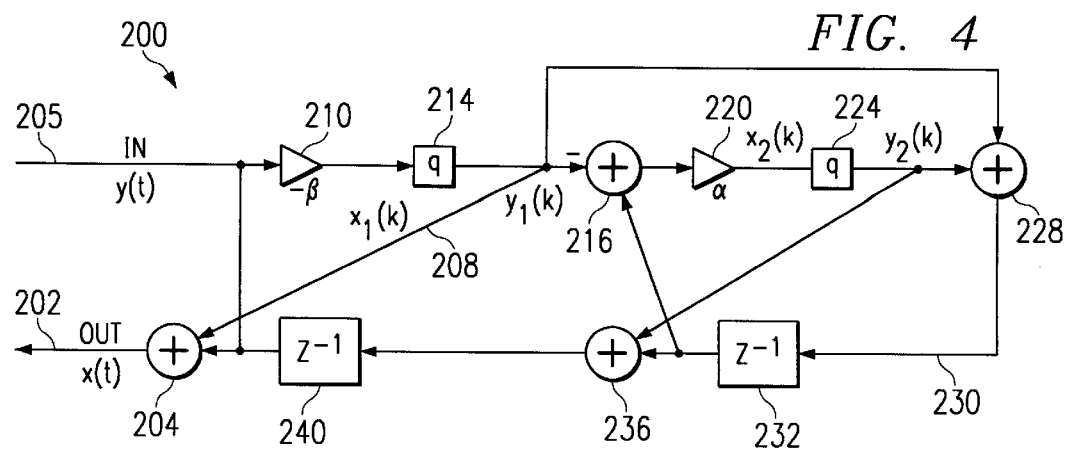
FIG. 4 is a type-1 second-order allpass lattice filter with two quantizers in accordance with the present invention.

FIG. 4 displays a second order allpass type-1 lattice filter with two quantizers in accordance with the present invention. In the embodiment shown, the signal y(t) to be filtered is applied to signal input 205, and thereby to multiplier 210. The signal output of multiplier 210 is applied to quantizer 214. The signal output of quantizer 214 is applied to accumulators 204, 216, and 228. The signal output of accumulator 216 is applied to multiplier 220. The signal output of multiplier 220 is applied to quantizer 224. The signal output of quantizer 224 is applied to accumulator 228 and accumulator 236. The signal output of accumulator 228 is applied to unit delay 232. The signal output of unit delay 232 is applied to accumulators 236 and 216. The signal output of accumulator 236 is applied to unit delay 240. The signal output of unit delay 240 is applied to accumulator 204. The outputs of quantizer 214 and unit delay 240 along with the signal input 205 are summed at output accumulator 204 to produce the filter output 202, represented by signal z(t).

It is well known that a second-order allpass filter can be described by transfer function:

$$H(z) = \frac{\beta+\alpha(1+\beta)z^{-1}+z^{-2}}{1+\alpha(1+\beta)z^{-1}+\beta z^{-2}}$$

wherein the absolute value of $\alpha$ and $\beta$ is less than one.

In order to avoid double-precision additions, the quantizers in the type-1 lattice structure are placed right after the multipliers. The Hemitian part of the transmission matrix for the system depicted in FIG. 4 is derived as follows:

$$W_H = \frac{1}{2}\begin{bmatrix} (-\beta z^{-1}-\beta z^2-2) & -\beta^{-1}(1+z^{-1})+\alpha(1-z) \\ -\beta z(1+z)z^{-1}+\alpha(1-z^{-1}) & (-\alpha z^{-1}-\alpha z-2) \end{bmatrix} \quad (4)$$

Accordingly, the polynomial $|\lambda I-W_H \text{Å}=\lambda^2+b\lambda+c$ has the following parameters:

$$b=2+\alpha\cos\phi+\beta\cos2\phi$$

$$c=1-0.5(\alpha^2+\beta^2)-0.5(2\alpha+\alpha^2-\beta^2+\alpha\beta)\cos\phi-1+\alpha\cos\phi)\beta\cos1\phi-0.5\alpha\beta\cos3\phi \quad [5]$$

In order to generate a type-1 lattice structure free of limit cycles, the allpass coefficients, $\alpha$ and $\beta$, must satisfy conditions such that b and c are positive values. By implication, the quadrature equation, $\lambda^2+b\lambda+c$, has two negative-value roots given $0\leq\phi\leq\pi$.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed is:

1. An allpass digital filter, comprising:
   a digital filter circuit means comprising interconnected quantizers, delays, multipliers, and adders for defining a transfer function, said circuit means corresponding in order and values to intrinsic values of the transfer function, each of said quantizers coupled in series after a respective one of said multipliers to eliminate any double precision additions;

wherein said circuit means having the transfer function:

$$H(z) = \frac{\beta + \alpha(1+\beta)z^{-1} + z^{-2}}{1 + \alpha(1+\beta)z^{-1} + \beta z^{-2}}$$

wherein the absolute value of $\alpha$ is less than one and absolute value of $\beta$ is less than one.

2. A digital filter having a filter signal input, a filter signal output and a filter transfer function comprising:
- a first multiplier responsive to the filter signal input;
- a first quantizer responsive to the first multiplier;
- a first accumulator responsive to the first quantizer;
- a second multiplier responsive to the first accumulator;
- a second quantizer responsive to the second multiplier, the first and second quantizers coupled in series after a respective one of the first and second multipliers to eliminate any double precision additions;
- a second accumulator responsive to the second quantizer and the first quantizer;
- a first unit delay responsive to the second accumulator and having an output applied to the first accumulator;
- a third accumulator responsive to the second quantizer and the first unit delay;
- a second unit delay responsive to the third accumulator; and
- a fourth accumulator responsive to the second unit delay and the first quantizer, the fourth accumulator for providing a filter signal output.

* * * * *